United States Patent
D'Agosto, III

(10) Patent No.: US 6,842,405 B1
(45) Date of Patent: Jan. 11, 2005

(54) AUTOMATIC SELECTION OF RECORDING MODE IN PORTABLE DIGITAL AUDIO RECORDER

(75) Inventor: Nicholas A. D'Agosto, III, Trumbull, CT (US)

(73) Assignee: Dictaphone Corporation, Stratford, CT (US)

( * ) Notice: Subject to any disclaimer, the term of this patent is extended or adjusted under 35 U.S.C. 154(b) by 854 days.

(21) Appl. No.: 09/672,343

(22) Filed: Sep. 28, 2000

Related U.S. Application Data

(60) Provisional application No. 60/156,858, filed on Sep. 30, 1999.

(51) Int. Cl.[7] .............................................. G11B 19/00
(52) U.S. Cl. .................................................. 369/29.02
(58) Field of Search .......................... 369/25.01, 29.02, 369/26.01, 29.01, 2, 27.01, 28.01, 11, 7; 700/94; 704/270, 201; 707/530; 381/91; 360/137, 69, 61

(56) References Cited

U.S. PATENT DOCUMENTS

| | | | |
|---|---|---|---|
| 5,191,431 A | | 3/1993 | Hasegawa et al. |
| 5,440,529 A | | 8/1995 | Takezawa et al. |
| 5,491,774 A | * | 2/1996 | Norris et al. ................ 704/270 |
| 5,548,566 A | * | 8/1996 | Barker ..................... 369/29.02 |
| 5,818,800 A | * | 10/1998 | Barker ..................... 369/29.02 |
| 5,953,290 A | | 9/1999 | Fukuda et al. |
| 6,038,199 A | * | 3/2000 | Pawlowski et al. ....... 369/29.02 |
| 6,314,331 B1 | * | 11/2001 | D'Agosto, III .............. 700/94 |
| 6,321,129 B1 | * | 11/2001 | D'Agosto, III .............. 700/94 |
| 6,571,211 B1 | * | 5/2003 | Dwyer et al. ................ 704/270 |
| 6,671,567 B1 | * | 12/2003 | Dwyer et al. ................. 700/94 |

* cited by examiner

*Primary Examiner*—Ali Neyzari
(74) *Attorney, Agent, or Firm*—Kelley Drye & Warren; Anthony L. Meola

(57) ABSTRACT

A portable digital audio recorder is operable with solid state memory cards having varying storage capacities. When a memory card is installed in the recorder, the recorder determines the storage capacity of the memory card. The recorder then automatically selects a recording mode based on the detected storage capacity of the memory card. When the memory card has a high storage capacity, the recorder'selects a high-quality recording mode, with low or, no data compression. When the storage capacity of the memory card is relatively small, the recorder selects a high-compression recording mode.

11 Claims, 2 Drawing Sheets

DIGITAL PORTABLE RECORDER (BLOCK DIAGRAM)

AUTOMATIC SELECTION
OF RECORDING MODE

AUTOMATIC SELECTION OF RECORDING MODE IN PORTABLE DIGITAL AUDIO RECORDER

CROSS-REFERENCE TO RELATED APPLICATION

This application claims benefit of provisional application ser. no. 60/156,858, filed Sep. 30, 1999.

1. Field of the Invention

This invention is concerned with portable digital audio recorders, and more particularly with such recorders that employ removable solid state memory devices for storing audio signals.

2. Background of the Invention

Very compact audio recorders in which sounds, such as dictation, are recorded on solid state digital memory devices, are well known. Some digital audio recorders operate to store audio information on removable memory cards. One such recorder is the "Walkabout Tour" recorder available from Dictaphone Corporation, which the assignee hereof.

In general, it is desirable to record audio information at the highest possible degree of compression consistent with adequate sound quality and reasonable processing overhead. The primary benefit of high compression recording is that it maximizes the available capacity in the recording medium. However, sound quality that is adequate for some purposes, such as audible playback and/or review by a transcriptionist, may not be adequate for other purposes, such as processing by speech recognition software.

OBJECTS AND SUMMARY OF THE INVENTION

It is an object of the invention to provide an improved portable digital audio recorder.

It is a further object of the invention to provide a portable digital audio recorder that adapts its operations to the characteristics of a removable memory device installed in the recorder.

According to a first aspect of the invention, a portable dig audio recorder includes structure for receiving a removable memory device, a removable memory device interfaced to the receiving structure, and a control circuit operatively connected to the removable memory device; the control circuit being arranged to determine a characteristic of the removable memory device, and to automatically select a recording mode of the recorder on the basis of the determined characteristic of the removable memory device.

According to further aspects of the invention, the control device is a microprocessor or the like and is programmed to detect the storage capacity of the removable memory device, which may be one of a number of different kinds of standard memory card. Depending on the detected storage capacity of the memory card, the processor selects between a plurality of recording modes, of which one of the modes provides a lower data rate (higher compression) but lower audio quality, whereas another of the modes provides a higher data rate (lower compression) but higher audio quality.

The automatic selection of the data rate allows the recorder to adapt itself to the storage capacity of the memory device installed therein. If the memory device has ample storage capacity, a high quality (though low compression) recording mode is employed. The resulting audio data maybe well-suited for subsequent processing, including speech recognition processing. If a relatively low capacity memory device is installed in the recorder, the recorder automatically selects a high compression recording mode, so that the relatively small recording capacity of the medium is preserved.

Other objects, features, and advantages of the invention will become apparent from subsequent more detailed description of preferred embodiments.

DESCRIPTION OF PREFERRED EMBODIMENTS

Figure 1:
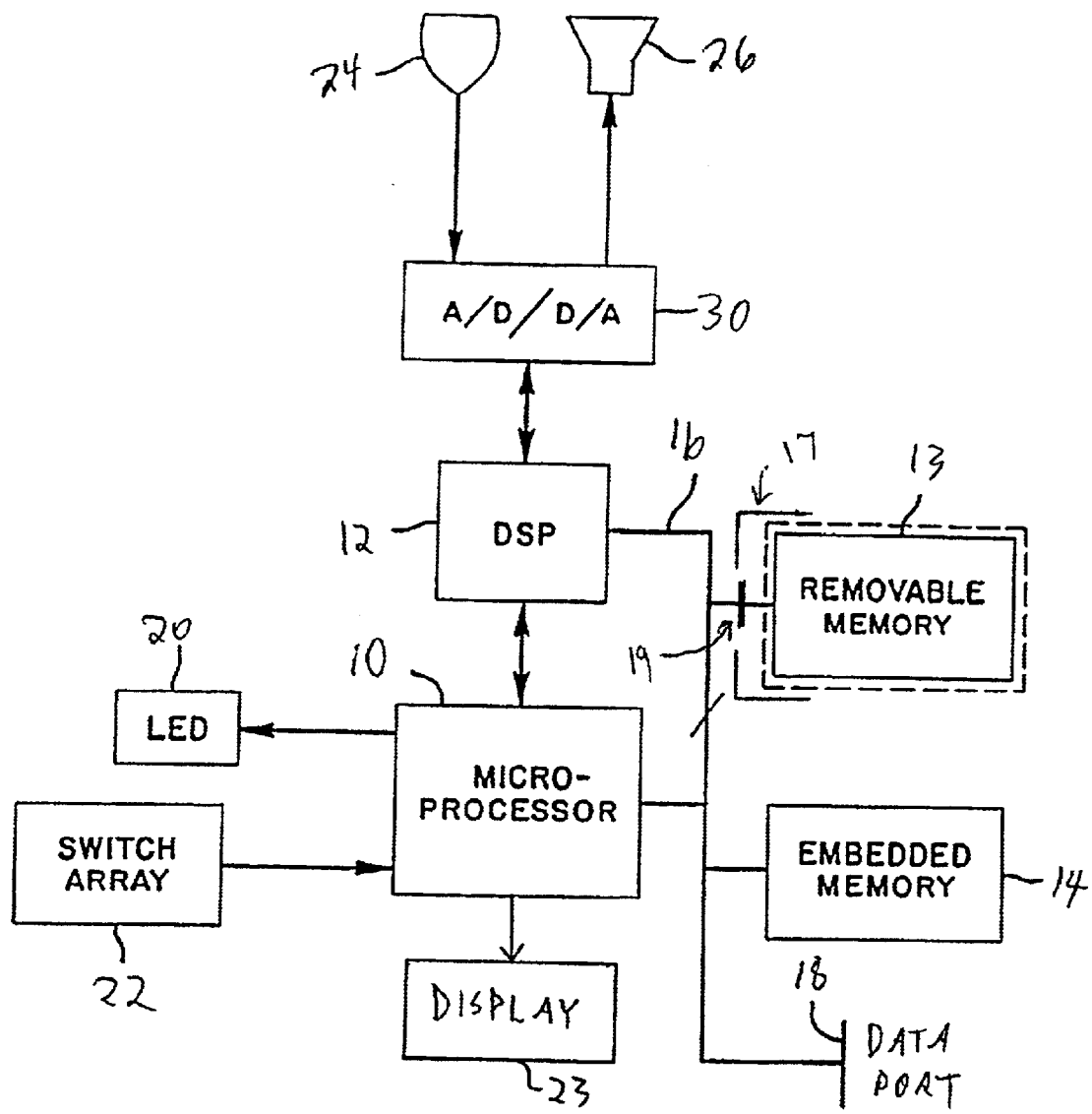
FIG. 1 illustrates in the form of a simplified and schematic block diagram a portable digital audio recorder in which the present invention may be applied.

The present invention is concerned with a feature that may advantageously be applied in a portable digital audio recorder that is capable of using plural types of removable recording media where the different recording media have different recording capacities. One example of such a portable audio recorder is the "Walkabout Tour" recorder commercially available from Dictaphone Corporation. In a typical portable digital recorder, voice recording may be carried out in accordance with the so-called "TrueSpeech" compression algorithm, which operates at an 8.5 kbps data rate. This can be considered a "high compression" recording mode, and provides sound quality that is adequate for playback and transcription by a human operator. This recording algorithm also makes very efficient use of available storage capacity. The present invention calls for adding at least one additional recording mode in a portable digital audio recorder, such that the additional mode or modes provide higher quality recording, i.e., higher fidelity. It will be understood that this is likely to require a higher data rate, resulting in lower compression. One example of a higher-quality/lower-compression recording mode that might be employed would be the known u-law PCM recording algorithm, which operates at a data rate of 64 kbps. Voice signals recorded using such an algorithm are generally considered suitable for processing by known speech recognition software packages. One such software package is marketed by IBM under the brand "ViaVoice".

While it is contaminated that selection between the two or more recording modes may be made in response to operator input, the invention further provides that the recorder may automatically select among recording modes depending on the type of removable recording medium loaded into the recorder.

Conventional portable digital audio recorders are operable with removable memory cards including standard memory cards such as the CF (compact flash) card, the so-called minicard, and the SSFDC card. All of these cards are produced in various memory capacities. For example, in a recorder for which the present invention is applicable, any one of six different CF cards may be employed, having respective storage capacities of 2 MB, 4 MB, 10 MB, 15 MB, 20 MB and 30 MB.

The present invention contemplates that upon a memory card being loaded into the recorder, the recorder automatically detects the capacity of the memory card and considers the card to have a "low" recording capacity if, for example, the card storage capacity is 2, 4 or 10 MB. Conversely, cards having a storage capacity of 15, 20 or 30 MB would be considered "high" capacity cards. When a low capacity card is found to have been installed, the present invention calls for the recorder to automatically select a high compression recording mode. When a high-capacity card is found to have been installed, the "high quality" (low compression) recording mode would be automatically selected. In either case, the operator preferably would be permitted to override the automatic mode selection, regardless of the recording capacity of the installed memory card.

FIG. 1 shows a simplified block diagram of a portable recorder in which the invention is applied. The recorder includes a microprocessor 10, a digital signal processor 12, a removable memory 13 and an imbedded memory 14, all of which are connected by a data bus 16.

The recorder includes a receptacle (schematically indicate 17) for receiving the removable memory 13. The removable memory 13 is selectively installable in and removable from the receptacle 17 and is interfaceable to the data bus 16 via contacts shown in schematic form at 19.

Also connected to the data bus 16 is a data port 18. An indicator light (LED) 20 is controlled by the microprocessor 10, and is illuminated to indicate when the recorder is recording. A switch array 22 is interfaced to the microprocessor 10 and is used to provide user input signals to the microprocessor 10. A display 23 (such as an LCD) is driven by the microprocessor 10 and forms part of the user interface. A microphone 24 and speaker 26 are connected to the DSP 12 via a circuit 30 which provides analog-to-digital and digital-to-analog conversion.

Except possibly for the recording capacity of the removable memory 13, the hardware making up the portable recorder of FIG. 1 may be identical to that of the above-mentioned Walkabout Tour recorder distributed by Dictaphone Corporation. It will be recognized that the teachings of the present invention are applicable to other hardware arrangements including other known portable recorders.

Software for controlling the recorder to carry out the invention may be stored in the imbedded memory 14 or may be included in the microprocessor.

Figure 2:
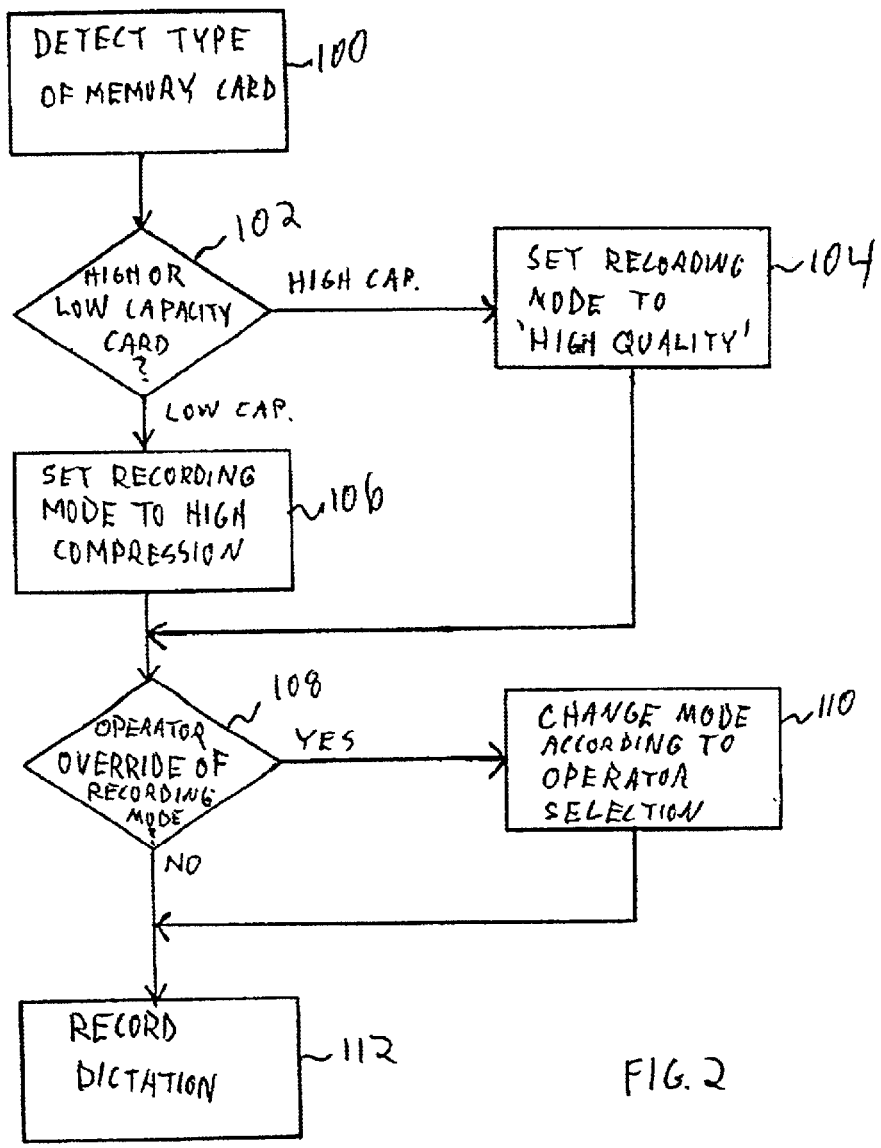
FIG. 2 is a flow chart that illustrates a process, carried out in accordance with the invention, whereby the recorder of FIG. 1 automatically selects a recording mode.

FIG. 2 is a flow chart that illustrates a process carried out, in accordance with the invention, to select the recording mode on the basis of the type of removable memory card installed in the recorder.

A first step 100 shown in FIG. 2 indicates that the microprocessor 10 detects what type of memory card (i.e. high capacity (say, greater than 10 MB) or low capacity (10 MB or less)) has been installed in the porte recorder. Preferably the microprocessor determines the storage capacity of the installed memory card in the course of performing a memory check. Decision block 102 is indicative of a determination as to whether a high or a low capacity card has been installed. If a high capacity card has been installed, then the recording mode is automatically set to the high quality mode, to produce voice files suitable for processing by speech recognition software (step 104).

If at block 102 it was found that a low capacity memory card was installed, then the recording mode is automatically set to the high compression mode (step 106).

Next, as indicated by decision block 108, it is determined whether the operator has selected a recording mode other than the one automatically selected by the recorder based on the type of memory card. The operator's selection of a recording mode may be indicated by inputting via a switch of the switch array 22 a recording mode selection signal that is received by the microprocessor 10.

If the operator has selected a recording mode other than the automatically selected mode, the recording mode is changed in accordance with the selection made by the operator (step 110). Otherwise, recording of dictation (step 112) proceeds at the recording mode automatically set at step 104 or step 106, as the case may be.

The present invention is advantageous in that it adds to the "intelligence" and user-friendliness of portable digital audio recorders. With the feature of the present invention, a portable digital audio recorder automatically provides a high-quality recording mode when a high-capacity memory card is installed in the recorder. The resulting stored voice signals are thus suitable for speech recognition and other demanding applications.

On the other hand, when a low-capacity memory card is installed in the recorder, the recorder automatically selects a high-compression recording mode to maximize the effective capacity of the recording medium.

Although the preferred embodiment of the invention described above characterizes memory cards having 10 MB of storage or less as being "low" capacity, other dividing-points between high- and low-capacity cards may be selected. It should also be noted that the invention is useful even if as few as two different sizes (storage capacities) of card-are usable in the recorder.

It is to be understood that the above description may indicate to those skilled in the art additional ways in which the principles of this invention may be used without departing from the spirit of the invention. The particularly preferred methods and apparatus are thus intended in an illustrative and not limiting sense. The true spirit and scope of the invention are set forth in the following claims.

What is claimed is:

1. A method of operating a portable digital audio recorder, the method comprising the steps of:

providing a removable memory device;

installing the removable memory device in the recorder;

determining a characteristic of the installed removable memory device; and automatically selecting a recording mode of the recorder on the basis of a result of the determining step.

2. A method according to claim 1, wherein said determining step includes detecting a recording capacity of the memory device.

3. A method according to claim 2, wherein said selecting step includes selecting between a first recording mode having a first degree of data compression and a second recording mode having a second degree of data compression that is higher than said first degree of data compression.

4. A method according to claim 3, wherein said first recording mode is selected if the detected recording capacity of the memory device is not less than a predetermined recording capacity, and said second recording mode is selected if the detected recording capacity of the memory device is less than said predetermined recording capacity.

5. A method according to claim 1, wherein said removable memory device is a solid state memory card.

6. A method according to claim 1, further comprising the steps of:

receiving a mode selection signal from a human operator; and in response to the received mode selection signal, changing over from the recording mode selected at said selecting step to a different recording mode.

7. A portable digital audio recorder, comprising:

means for receiving a removable memory device;

a removable memory device interfaced to said means for receiving; and a control device operatively connected to said removable memory device; said control device being arranged to:

detect a characteristic of the removable memory device; and automatically select a recording mode of the recorder on the basis of the detected characteristic of the removable memory device.

8. A recorder according to claim 7, wherein said characteristic of the removable memory device detected by the control device is a recording capacity of the memory device.

9. A recorder according to claim 8, wherein the control device selects a first recording mode if the detected recording capacity is not less than a predetermined recording capacity, and the control device selects a second recording mode if the detected recording capacity is less than the predetermined recording capacity, said first recording mode having a degree of data compression that is lower than a degree of data compression of said second recording mode.

10. A recorder according to claim 7, wherein said removable memory device is a solid state memory card.

11. A recorder according to claim 7, wherein said control device is a microprocessor.

* * * * *